US012757337B2

(12) United States Patent
Ginjupalli et al.

(10) Patent No.: US 12,757,337 B2
(45) Date of Patent: Oct. 6, 2026

(54) SEMICONDUCTOR ASSEMBLY GAP FILLER

(71) Applicant: Micron Technology, Inc., Boise, ID (US)

(72) Inventors: Jagadeesh Babu Ginjupalli, Fremont, CA (US); Charles Everett Siko, Boise, ID (US); Darin Michael Bushey, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 409 days.

(21) Appl. No.: 18/496,618

(22) Filed: Oct. 27, 2023

(65) Prior Publication Data

US 2024/0155783 A1 May 9, 2024

Related U.S. Application Data

(60) Provisional application No. 63/382,966, filed on Nov. 9, 2022.

(51) Int. Cl.

| | |
|---|---|
| ***H05K 5/00*** | (2025.01) |
| ***C01B 33/02*** | (2006.01) |
| ***C09D 1/00*** | (2006.01) |
| ***C09D 5/02*** | (2006.01) |
| ***H05K 5/02*** | (2006.01) |
| ***H05K 7/20*** | (2006.01) |
| ***H05K 9/00*** | (2006.01) |
| *H10B 80/00* | (2023.01) |
| *H10W 90/00* | (2026.01) |
| *H10W 90/24* | (2026.01) |

(52) U.S. Cl.
CPC ............... *H05K 5/02* (2013.01); *C01B 33/02* (2013.01); *C09D 1/00* (2013.01); *C09D 5/021* (2013.01); *H05K 7/2039* (2013.01); *H05K 9/0079* (2013.01); *C01P 2004/61* (2013.01); *H10B 80/00* (2023.02); *H10W 90/00* (2026.01); *H10W 90/24* (2026.01)

(58) Field of Classification Search
CPC ........ H05K 5/02; H05K 7/2039; C01B 33/02; C09D 1/00; C09D 5/021
USPC .......................................................... 361/714
See application file for complete search history.

(56) References Cited

U.S. PATENT DOCUMENTS 4,696,776 A * 9/1987 Hooker .................. B29C 70/66 264/46.7
4,729,062 A * 3/1988 Anderson ............. H05K 3/288 29/829
5,538,779 A * 7/1996 Mispreuve ......... C08G 18/7664 521/137

(Continued)

*Primary Examiner* — Zhengfu J Feng
(74) *Attorney, Agent, or Firm* — Harrity & Harrity, LLP

(57) ABSTRACT

Implementations described herein relate to various semiconductor device assemblies. In some implementations, a semiconductor device assembly may include a printed circuit board (PCB) having a first side and a second side, an enclosure that encloses the PCB and includes one or more injection holes, and microbead foam. The first side and/or the second side of PCB may include a plurality of components. The one or more injection holes may be configured for injecting the microbead foam into a gap between the enclosure and one or more components of the plurality of components. At least a portion of the microbead foam may be located in the gap between the enclosure and the one or more components.

25 Claims, 8 Drawing Sheets

(56) References Cited

U.S. PATENT DOCUMENTS

| | | | | |
|---|---|---|---|---|
| 9,387,633 | B1 * | 7/2016 | Vinciarelli | B29C 70/72 |
| 2002/0139554 | A1 * | 10/2002 | Kubota | A62C 2/065<br>174/50 |
| 2010/0020512 | A1 * | 1/2010 | Batcheller | H05K 1/0271<br>361/752 |
| 2016/0240227 | A1 * | 8/2016 | Cyr | G11C 5/025 |
| 2023/0328910 | A1 * | 10/2023 | Yang | G06F 1/20<br>361/748 |

* cited by examiner

SEMICONDUCTOR ASSEMBLY GAP FILLER

CROSS-REFERENCE TO RELATED APPLICATION

This patent application claims priority to U.S. Provisional Patent Application No. 63/382,966, filed on Nov. 9, 2022, and entitled "SEMICONDUCTOR ASSEMBLY GAP FILLER." The disclosure of the prior application is considered part of and is incorporated by reference into this patent application.

TECHNICAL FIELD

The present disclosure generally relates to semiconductor devices and methods of forming semiconductor devices. For example, the present disclosure relates to a semiconductor assembly gap filler.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes means for connecting internal components to external components (e.g., a circuit board), such as via balls, pins, or leads. A semiconductor package is sometimes referred to as a semiconductor device assembly.

DETAILED DESCRIPTION

Figure 1:
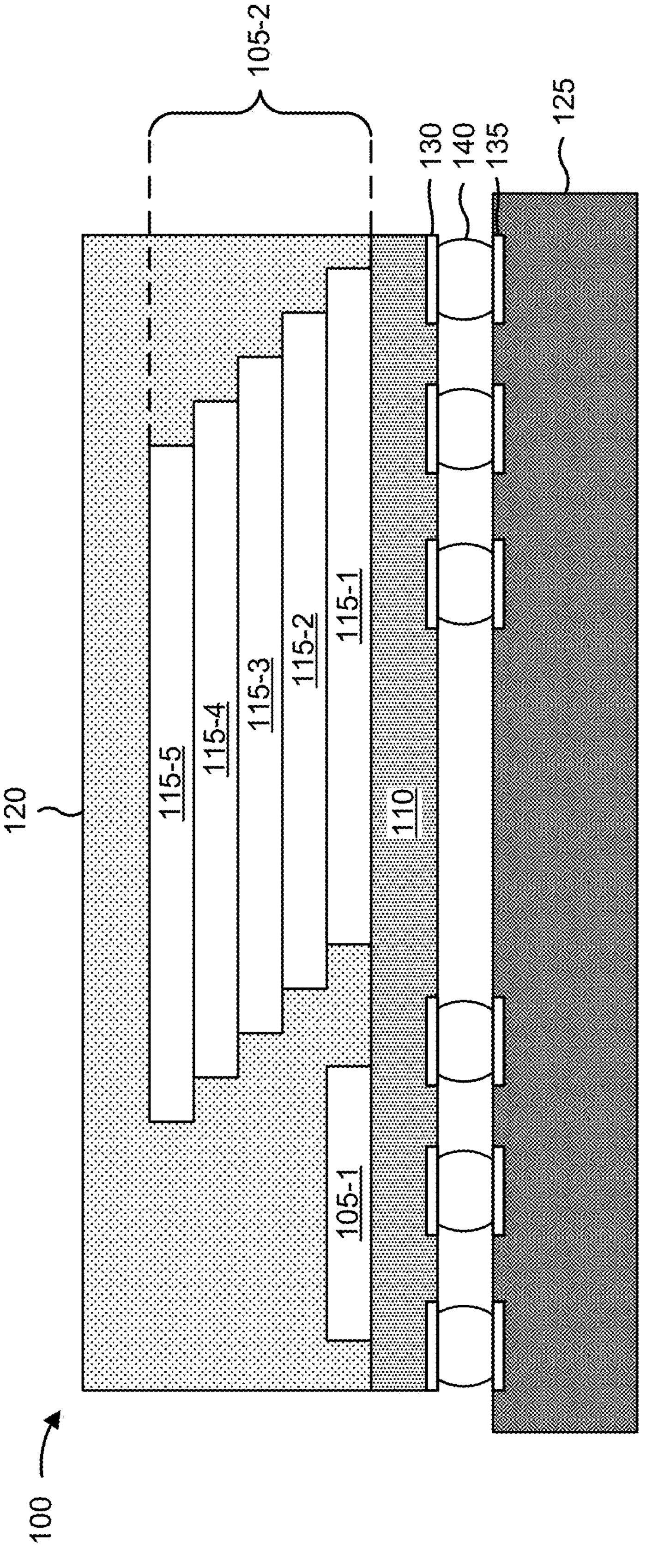
FIG. 1 is a diagram of an example apparatus that may be manufactured using techniques described herein.

A semiconductor device assembly may include a printed circuit board (PCB) and an enclosure. In some cases, the semiconductor device assembly may include two or more PCBs that are enclosed within the enclosure. The PCB may be a rigid PCB, a flexible PCB, or a combination of a rigid PCB and a flexible PCB.

A PCB may have two or more surfaces. In one example, the PCB may have a first surface and a second surface. The first surface may be a top surface of the PCB or a bottom surface of the PCB and the second surface may be the other of the top surface of the PCB or the bottom surface of the PCB. At least one of first surface or the second surface of the PCB may include one or more components. In some cases, the PCB may be a rigid-flex-rigid (RFR) PCB. The RFR PCB may be folded or otherwise bent along a wire. When the RFR PCB is folded or bent along the wire, the RFR PCB may include a first interior portion, a second interior portion, a first exterior portion, and a second exterior portion. At least some of the first interior portion, the second interior portion, the first exterior portion, and the second exterior portion may include one or more components.

In some cases, a component may come into contact with the enclosure or one or more other components that are included within the enclosure. In an example where the enclosure includes a single PCB, a component located on a top surface or a bottom surface of the PCB may come into contact with a surface of the enclosure. In an example where the enclosure includes two PCBs, components located on respective PCBs may come into contact with each other or with the interior surface of the enclosure. For example, a component located on a bottom surface of a first PCB may come into contact with a component located on a top surface of a second PCB. In an example where the enclosure includes an RFR PCB, components located on the RFR PCB may come into contact with other components located on the RFR PCB or with an interior surface of the enclosure. For example, a component located on the first interior surface may come into contact with a component located on the second interior surface, while a component located on the first exterior surface or the second exterior surface may come into contact with the enclosure. When a component comes into contact with another component or a surface of the enclosure, the component may become damaged. For example, the component may chip or may break entirely. This may cause the semiconductor device assembly to fail or otherwise not function properly.

In some cases, a foam block may be placed on a component to prevent the component from becoming damaged. For example, a foam block may be placed between a first component and a second component within the enclosure, or may be placed between the component and an interior surface of the enclosure. The foam block may prevent the component from becoming damaged, such as from chipping or breaking. However, using foam blocks to prevent the components from becoming damaged may be a complex process and may introduce significant manufacturing time into the semiconductor device assembly. For example, each foam block may need to be cut to a particular size of the component. A PCB may include a number of components having various sizes, and foam blocks having various sizes may need to be used for protecting the components. A manufacturer may need to determine or otherwise identify each component located on the PCB, the location of each component on the PCB, and another component or enclosure surface that the component may come into contact with. Further, the foam blocks may need to be placed on the components prior to the PCB being enclosed within the enclosure. As described above, this may be a complex process and may introduce significant manufacturing time into the semiconductor device assembly.

Some implementations described herein include a microbead foam for protecting components within a semiconductor device assembly. The microbead foam may be used to protect the components within the semiconductor device assembly from becoming damaged. The microbead foam may be injected into the enclosure via one or more injection holes after the PCB has been enclosed within the enclosure. The microbead foam, after being injected into the enclosure via the one or more injection holes, may expand to fill one or more gaps between a component and another component or between the component and an interior surface of the enclosure. The microbead foam may be expanding, heat-dissipating, non-conductive, non-adhesive, and/or electrostatically discharging. In some implementations, the microbead foam may be a silicon-based microbead foam. Unlike foam blocks, which need to be cut to a particular size that is based on a size of the component, the microbead foam may expand to fill gaps of any size. Similarly, while the foam blocks need to be placed on the component prior to the PCB being enclosed within the enclosure, the microbead foam may be injected into the enclosure via the injection holes after the PCB is enclosed within the enclosure. The microbead foam is easy to dispense and provides increased shock and/or vibration capability. The microbead foam is easily removed or adjusted since the microbead foam is non-adhesive and does not stick to the components or the enclosure. The microbead foam is shape forming and shape retaining. This enables the microbead foam to be used for components having any size. For example, the microbead foam may expand within the enclosure to fill gaps having any size or dimensions. This may reduce a likelihood of the component becoming damaged, such as from chipping or breaking as a result of contacting another component or an interior surface of the enclosure. As a result, the semiconductor package assembly may be more durable, while a manufacturing process for the semiconductor package assembly may be less complex and less time consuming.

FIG. 1 is a diagram of an example apparatus 100 that may be manufactured using techniques described herein. The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a dynamic RAM (DRAM) device, a static RAM (SRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include multiple semiconductor dies 115 (sometimes called dies), shown as five semiconductor dies 115-1 through 115-5. As shown in FIG. 1, the dies 115 may be stacked on top of each other to reduce a footprint of the apparatus 100. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on.

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a plastic (e.g., an epoxy plastic), a ceramic, or another type of material depending on the functional requirements for the apparatus 100.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
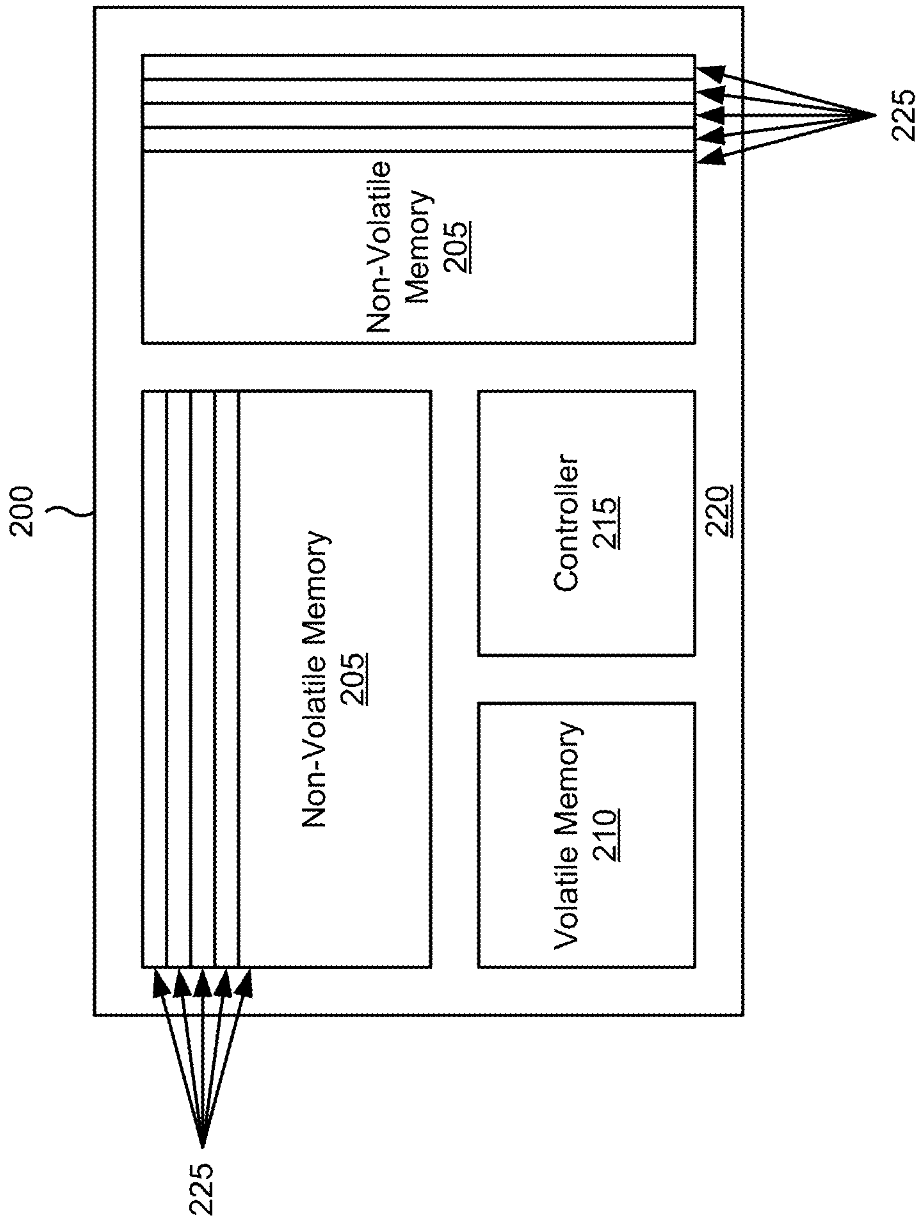
FIG. 2 is a diagram of an example memory device that may be manufactured using techniques described herein.

FIG. 2 is a diagram of an example memory device 200 that may be manufactured using techniques described herein. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

As shown, the memory device 200 may include non-volatile memory 205, volatile memory 210, and a controller 215. The components of the memory device 200 may be mounted on or otherwise disposed on a substrate 220. In some implementations, the non-volatile memory 205 includes stacked semiconductor dies 225, as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions. Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3:
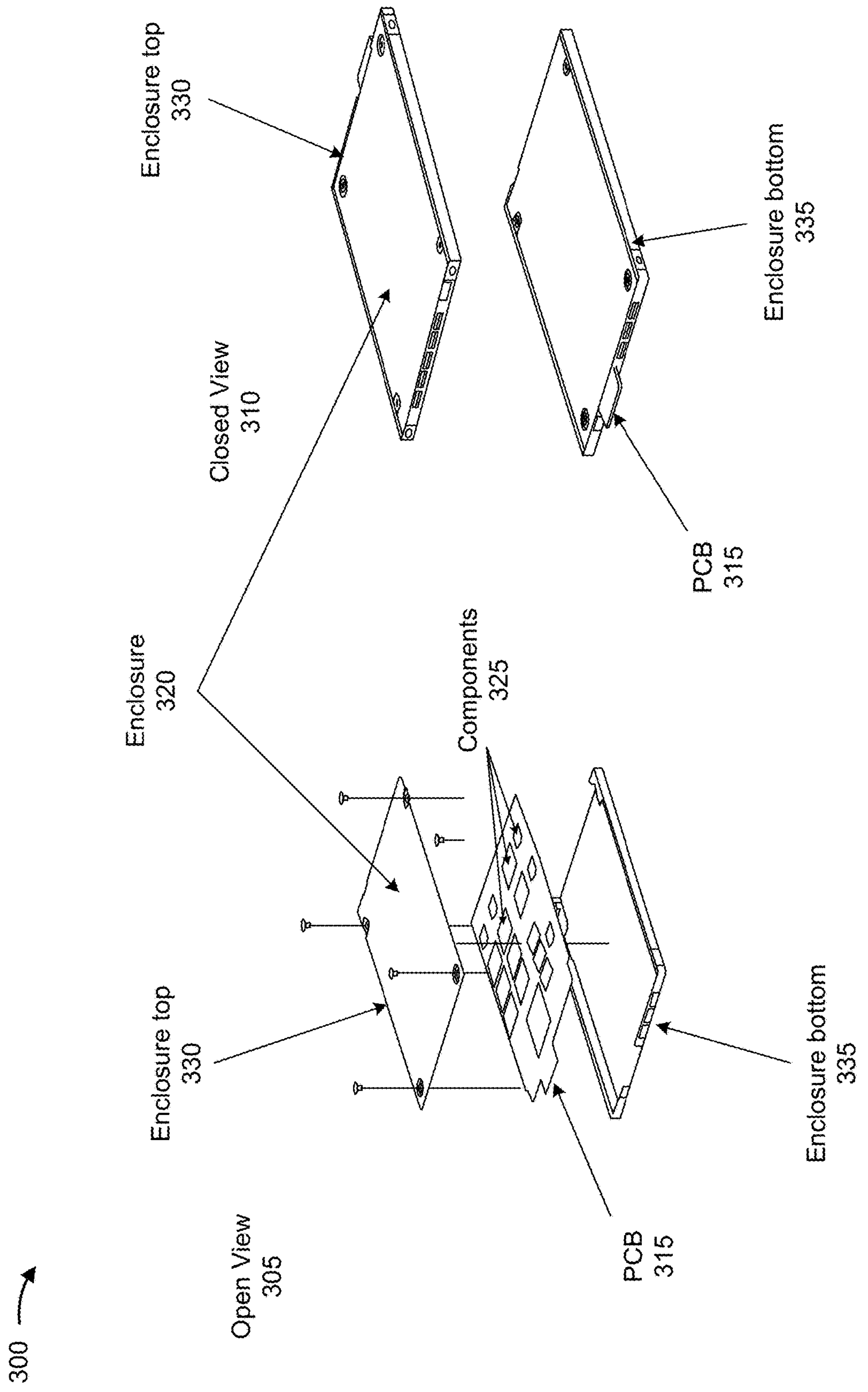
FIG. 3 is a diagram illustrating an example of a semiconductor device assembly.

FIG. 3 is a diagram illustrating an example of a semiconductor device assembly 300. A first example shows an open view 305 of the semiconductor device assembly 300 and a second example shows a closed view 310 of the semiconductor device assembly 300. The semiconductor device assembly 300 may include a PCB 315 and an enclosure 320. The PCB 315 may be the circuit board 125 described herein. The enclosure 320 may be the casing 120 or may include some or all of the features of the casing 120. The PCB 315 may include one or more components 325. The one or more components may be integrated circuits, resistors, transistors, capacitors, inductors, transmitters, rectifiers, diodes, sensors, batteries, or any component that is configured for use with the PCB 315. At least one of a top surface of the PCB 315 or a bottom surface of the PCB 315 may include the one or more components 325. For example, the top surface of the PCB 315 may include one or more components 325, the bottom surface of the PCB 315 may include one or more components 325, or both the top surface and the bottom surface of the PCB 315 may include one or more components 325.

The enclosure 320 may include an enclosure top 330 and an enclosure bottom 335. The PCB 315 may be enclosed within the enclosure top 330 and the enclosure bottom 335. For example, the PCB 315 may be enclosed between the enclosure top 330 and the enclosure bottom 335. As shown by the open view 305, a top surface of the PCB 315 may be facing in a direction that is toward the enclosure top 330, and a bottom surface of the PCB 315 may be facing in a direction that is toward the enclosure bottom 335. As shown by the closed view 310, the PCB 315 may be at least partially enclosed within the enclosure 320. The PCB 315 may be "enclosed" within the enclosure 320 when at least a portion (e.g., most) of the PCB 315 is enclosed within the enclosure 320. For example, the PCB 315 may be enclosed within the enclosure 320 when a surface of the PCB 315 that includes the components 325 is enclosed between the enclosure top 330 and the enclosure bottom 335. In some cases, a portion of the PCB 315, such as a tab, may not be enclosed between the enclosure top 330 and the enclosure bottom 335. The tab may not include any components 325. Thus, the PCB 315 may be considered to be enclosed within the enclosure 320 even when the tab is not enclosed between the enclosure top 330 and the enclosure bottom 335. The enclosure top 330, the PCB 315, and the enclosure bottom 335 may be secured using one or more screws. The terms "enclosure top" and "enclosure bottom" are relative terms. For example, a first surface of the enclosure 320 may be the enclosure top 330 and a second surface of the enclosure 320 may be the enclosure bottom 335 when the enclosure 320 is oriented in a first direction, whereas the first surface of the enclosure 320 may be the enclosure bottom 335 and the second surface of the enclosure 320 may be the enclosure top 330 when the enclosure 320 is oriented in a second direction. In some cases, the enclosure 320 may include multiple PCBs 315. Additional details are described herein.

As indicated above, FIG. 3 is provided as an example. Other examples may differ from what is described with regard to FIG. 3.

Figure 4:
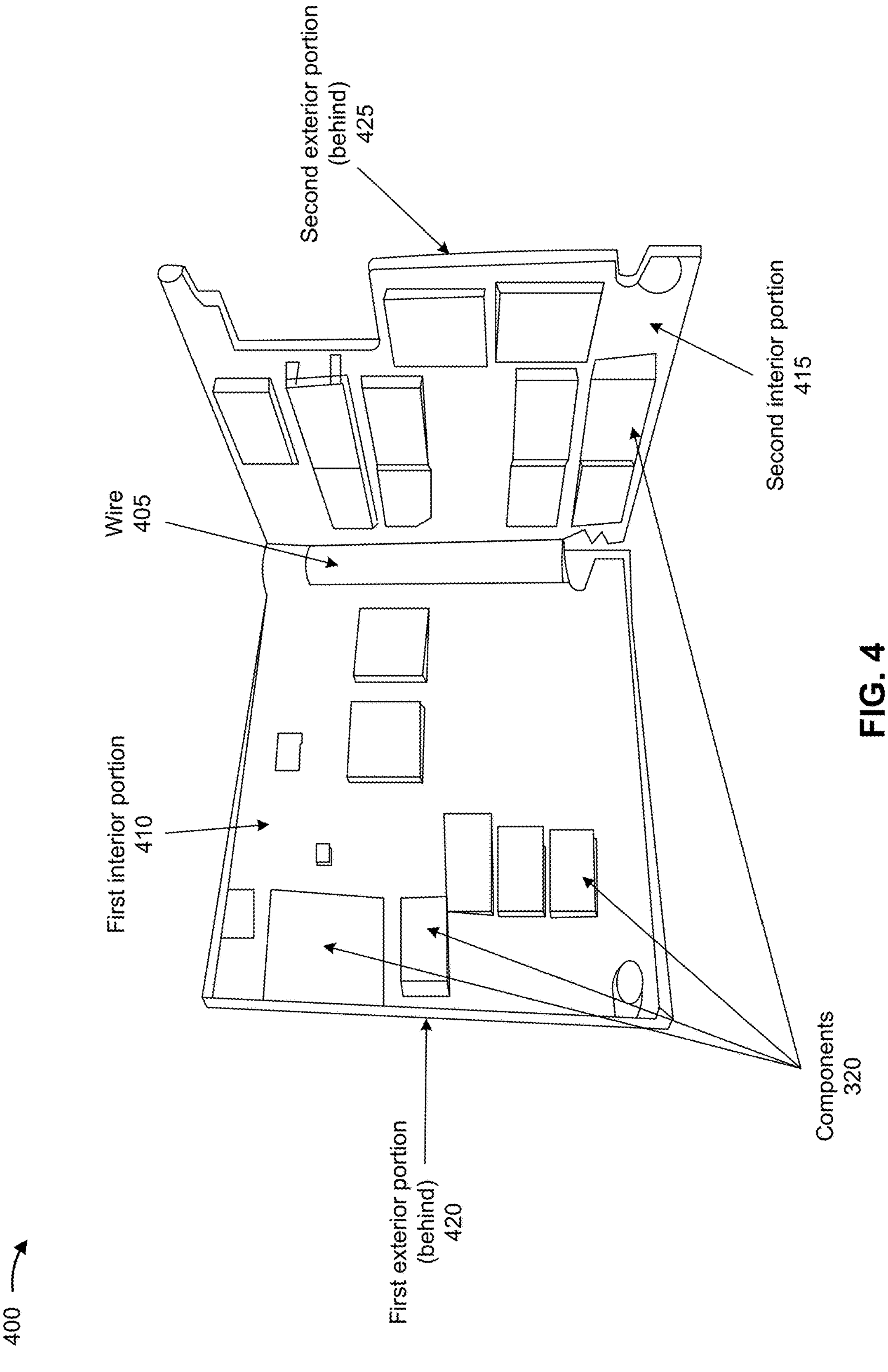
FIG. 4 is a diagram illustrating an example of a printed circuit board.

FIG. 4 is a diagram illustrating an example of a PCB 400. The PCB 400 may be a rigid PCB or a flexible PCB. A rigid PCB may inflexible, while a flexible PCB may be bent, folded, or otherwise shaped to fit inside a semiconductor device assembly.

In some cases, the PCB 400 may be a rigid PCB, may be a flexible PCB, or may include one or more features of a rigid PCB and one or more features of a flexible PCB. For example, the PCB 400 may be a rigid-flex-rigid (RFR) PCB. The RFR PCB 400 may include a top surface and a bottom surface that are separated by a wire, such as the wire 405. The wire 405 may be any component or material that can be used to fold or otherwise bend the RFR PCB 400. When the RFR PCB 400 is bent along the wire 405, the RFR PCB 400 may include a first interior portion 410, a second interior portion 415, a first exterior portion 420, and a second exterior portion 425. For example, when the RFR PCB 400 is in a bent state (along the wire 405), the first interior portion 410 may be facing in a direction that is toward the second interior portion 415, the second interior portion 415 may be facing in a direction that is toward the first interior portion 410, the first exterior portion 420 may be facing in a direction that is toward a top portion of an enclosure (such as the enclosure top 330), and the second exterior portion 425 may be facing in a direction that is towards a bottom portion of an enclosure (such as the enclosure bottom 335). In some cases, the wire 405 may separate the top surface of the RFR PCB 400 into the first interior portion 410 and the second interior portion 415, and may separate the bottom surface of the RFR PCB 400 into the first exterior portion 420 and the second exterior portion 425. At least some of the first interior portion 410, the second interior portion 415, the first exterior portion 420, and the second exterior portion 425 may include one or more components. In some examples, all of the first interior portion 410, the second interior portion 415, the first exterior portion 420, and the second exterior portion 425 include one or more components. Additional details are described herein.

As indicated above, FIG. 4 is provided as an example. Other examples may differ from what is described with regard to FIG. 4.

Figure 5:
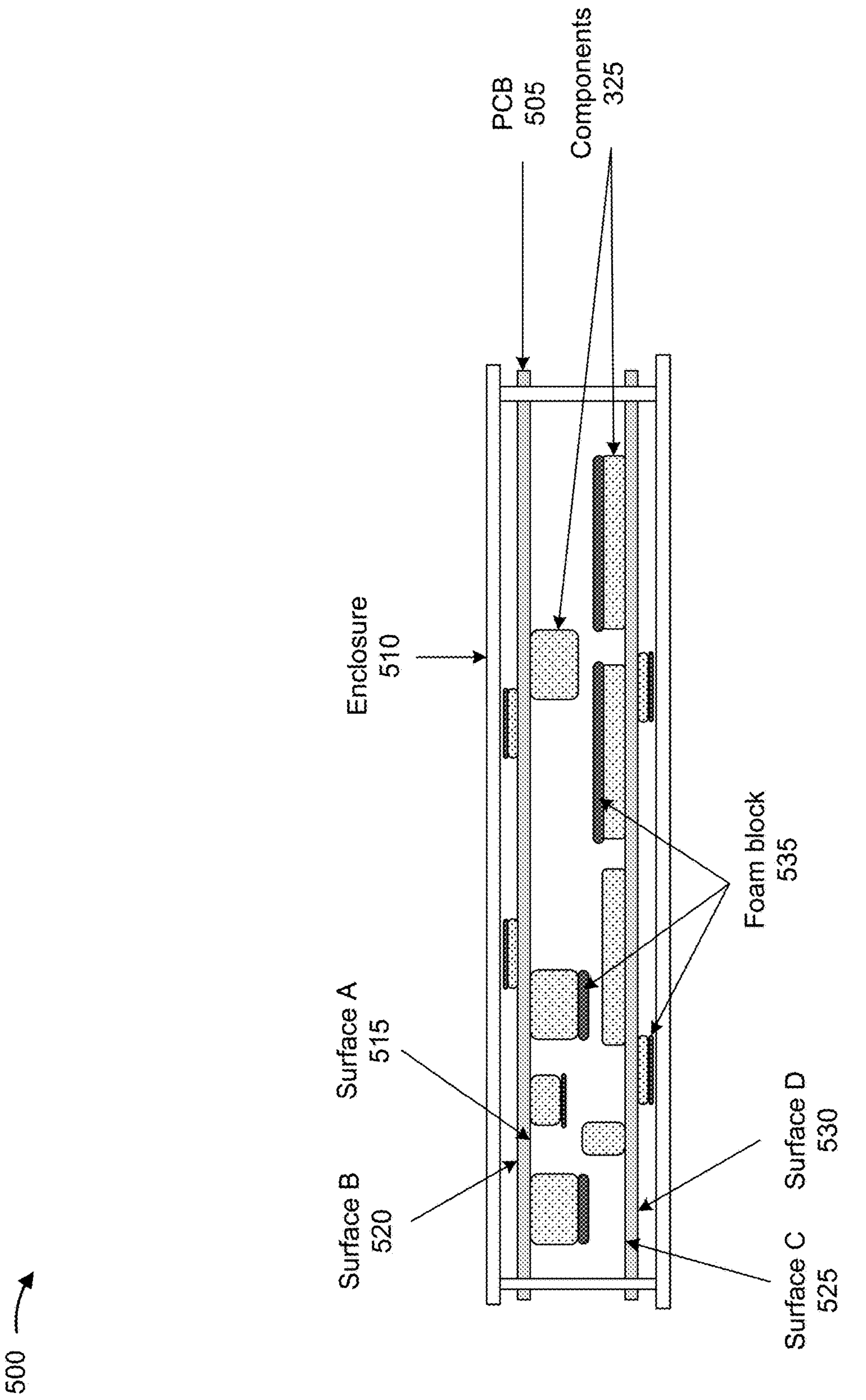
FIG. 5 is a diagram illustrating an example of a semiconductor device assembly that includes foam blocks.

FIG. 5 is a diagram illustrating an example of a semiconductor device assembly 500 that includes foam blocks. The semiconductor device assembly 500 may include a PCB 505 and an enclosure 510. The PCB 505 may include some or all features of the circuit board 125, the PCB 315, and/or the PCB 400. The enclosure 510 may include some or all features of the casing 120 and/or the enclosure 320.

The PCB 505 may have two or more surfaces. In one example, the PCB 505 may have a first surface (surface A 515) and a second surface (surface B 520). The first surface may be a top surface of the PCB 505 or a bottom surface of the PCB 505 and the second surface may be the other of the top surface of the PCB 505 or the bottom surface of the PCB 505. For example, the surface A 515 may be the top surface of the PCB 505 and the surface B 520 may be the bottom surface of the PCB 505. In some cases, the first surface of the PCB 505 may include one or more components 325, the second surface of the PCB 505 may include one or more components 325, or both the first surface and the second surface of the PCB 505 may include one or more components 325. The one or more components 325 are shown in the figure by the dotted shading. The PCB 505 may be a rigid PCB, a flexible PCB, or a PCB that includes one or more features of a rigid PCB and one or more features of a flexible PCB. The PCB 505 may be enclosed within the enclosure 510.

In some cases, the enclosure 510 may include two or more PCBs 505. For example, the enclosure 510 may include a first PCB 505-1 and a second PCB 505-2. The first PCB 505-1 may have the surface A 515 and the surface B 520. The second PCB 505-2 may have a first surface (surface C 525) and a second surface (surface D 530). The first surface may be a top surface or a bottom surface of the PCB 505-2 and the second surface may be the other of the top surface or the bottom surface of the PCB 505-2. For example, the surface C 525 may be the top surface of the PCB 505-2 and the surface D 530 may be the bottom surface of the PCB 505-2. In some cases, the first surface of the PCB 505-2 may include one or more components 325, the second surface of the PCB 505-2 may include one or more components 325, or both the first surface and the second surface of the PCB 505-2 may include one or more components 325. In some cases, the PCB 505-1 may be a rigid PCB, a flexible PCB, or a PCB that includes one or more features of a rigid PCB and one or more features of a flexible PCB. Similarly, the PCB 505-2 may be a rigid PCB, a flexible PCB, or a PCB that includes one or more features of a rigid PCB and one or more features of a flexible PCB. The semiconductor 505-1 and the PCB 505-2 may be enclosed within the enclosure 510.

In some cases, the PCB 505 may be an RFR PCB. For example, the PCB 505 may be the RFR PCB 400 that is bent or folded along the wire 405. The RFR PCB 400 may include a first interior portion, a second interior portion, a first exterior portion, and a second exterior portion. For example, the first interior portion may be the surface A 515, the second interior portion may be the surface C 525, the first exterior portion may be the surface B 520, and the second exterior portion may be the surface D 530. At least some of the first interior portion, the second interior portion, the first exterior portion, and the second exterior portion may include one or more components 325. In some examples, each of surface A 515, surface B 520, surface C 525, and surface D 530 includes one or more components 325. The RFR PCB 505 may be enclosed within the enclosure 510.

In some cases, a component 325 may come into contact with the enclosure 510 or one or more other components 325 included within the enclosure 510. In the example where the enclosure 510 includes a single PCB 505 (such as a rigid PCB or a flexible PCB), a component 325 located on a top surface or a bottom surface of the PCB 505 may come into contact with the enclosure 510. For example, a component 325 located on the surface A 515 may come into contact with an interior surface of the enclosure 510 and/or a component 325 located on surface B 520 may come into contact with another interior surface of the enclosure 510. In the example where the enclosure 510 includes two PCBs, such as the PCB 505-1 and the PCB 505-2, components 325 located on the PCB s may come into contact with an interior surface of the enclosure 510, a surface of another PCB 505, or another component 325 located on a surface of the other PCB 505. For example, a component 325 located on surface A 515 of the PCB 505-1 may come into contact with surface C 525 of the PCB 505-2 or one or more components 325 located on surface C 525 of the PCB 505-2. A component 325 located on surface C 525 of the PCB 505-2 may come into contact with surface A 515 of the PCB 505-1 or one or more components 325 located on surface A 515 of the PCB 505-1. A component 325 located on surface B 520 of the PCB 505-1 may come into contact with a top interior surface of the enclosure 510. A component 325 located on surface D 530 of the PCB 505-2 may come into contact with a bottom interior surface of the enclosure 510. In the example where the enclosure 510 includes an RFR PCB, components 325 located on the RFR PCB 505 may come into contact with an interior surface of the enclosure 510, another surface of the RFR PCB 505, or another component 325 located on another surface of the RFR PCB 505. For example, a component 325 located on surface A 515 of the RFR PCB 505 may come into contact with surface C 525 of the RFR PCB 505 or one or more components 325 located on surface C 525 of the RFR PCB 505. A component 325 located on surface C 525 of the RFR PCB 505 may come into contact with surface A 515 of the RFR PCB 505 or one or more components 325 located on surface A 515 of the RFR PCB 505. A component 325 located on surface B 520 of the RFR PCB 505 may come into contact with a top interior surface of the enclosure 510. A component 325 located on surface D 530 of the RFR PCB 505 may come into contact with a bottom interior surface of the enclosure 510. When a component 325 comes into contact with an interior surface of the enclosure 510, another component 325, or a surface of another PCB 505, the component 325 may become damaged. For example, the component 325 may chip or may break entirely.

In some cases, a foam block 535 may be placed on top of a component 325 to prevent the component 325 from becoming damaged. For example, a foam block 535 may be placed between the component 325 and an interior surface of the enclosure 510, between the component 325 and a surface of another PCB 505, or between the component 325 and another component 325 located on the surface of the other PCB 505. In some examples, a foam block 535 may be placed on a component 325 located on surface A 515 of the PCB 505 to prevent the component 325 from contacting the surface C 525 or a component 325 located on the surface C 525. A foam block 535 may be placed on a component 325 located on surface C 525 of the PCB 505 to prevent the component 325 from contacting the surface A 515 or a component 325 located on the surface A 515. A foam block 535 may be placed on a component 325 located on surface B 520 to prevent the component 325 from contacting a top interior surface of the enclosure 510. A foam block 535 may be placed on a component 325 located on surface D 530 to prevent the component 325 from contacting a bottom interior surface of the enclosure 510. The foam blocks 535 are shown in this figure by dark gray shading.

In some cases, the foam blocks 535 may prevent the components 325 from becoming damaged, such as from chipping or breaking. However, using foam blocks 535 to prevent the components 325 from becoming damaged may be a complex process and may introduce significant manufacturing time into the semiconductor device assembly 500. For example, each foam block 535 may need to be cut to a particular size of the component 325. A PCB 505 may include a number of components 325 having various sizes, and foam blocks 535 having various sizes may need to be used for protecting the components 325. Similarly, a depth of the foam block 535 may need to be based on a distance (e.g., a gap) between the component 325 and the other component 325 or surface that the component 325 may contact. For example, a top surface of a first component 325-1 may be a first distance from an interior surface of the enclosure 510 and a top surface of a second component 325-2 may be a second distance from the interior surface of the enclosure 510. A manufacturer may need to determine or otherwise identify each component 325 located on the PCB 505, the location of each component 325 on the PCB 505, and another component or surface that the component 325 may come into contact with. Further, the foam blocks 535 may need to be placed on the components 325 prior to the PCB 505 being enclosed within the enclosure 510. As described above, this may be a complex process and may introduce significant manufacturing time into the semiconductor device assembly 500.

As indicated above, FIG. 5 is provided as an example. Other examples may differ from what is described with regard to FIG. 5.

Figure 6:
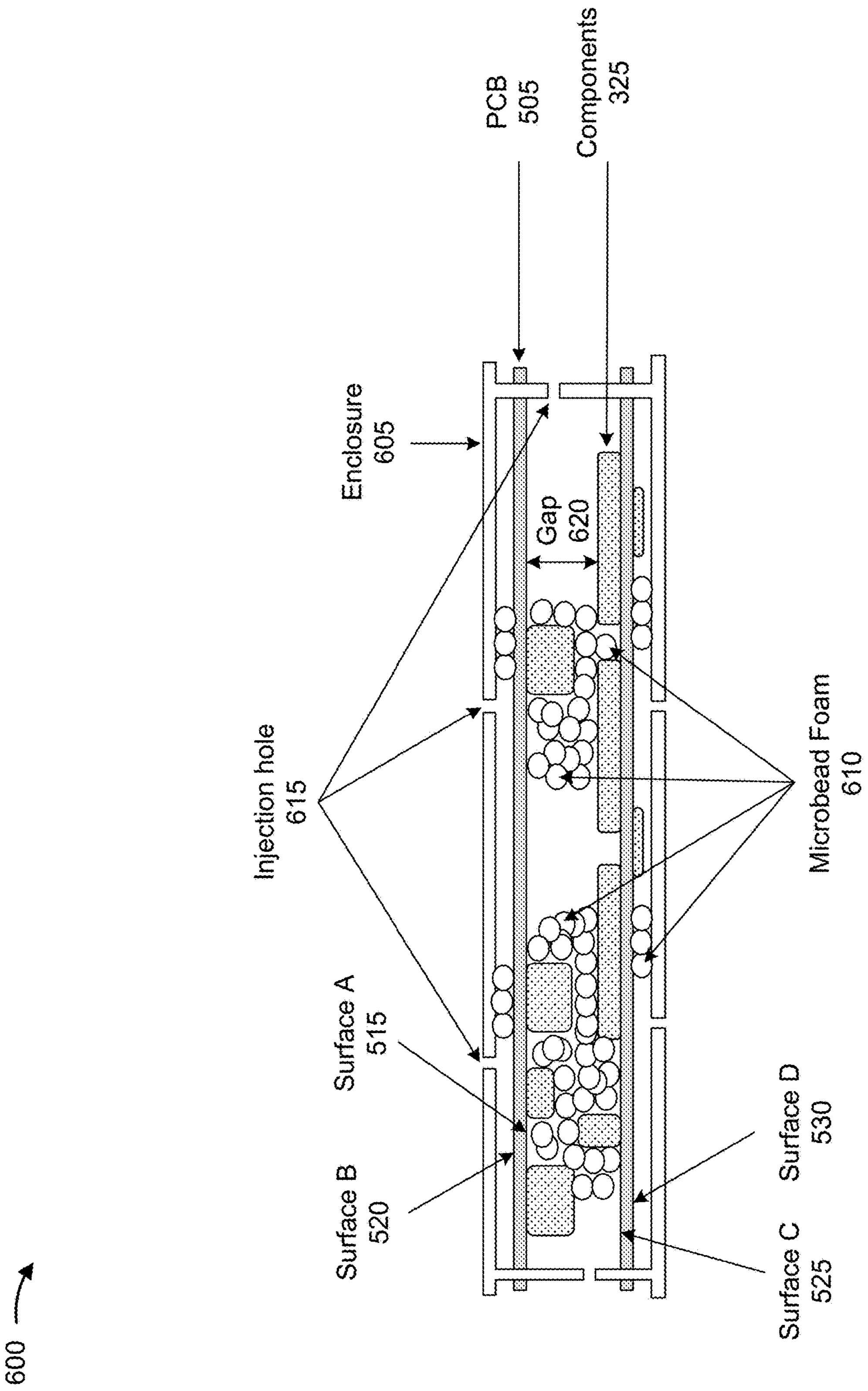
FIG. 6 is a diagram illustrating an example of a semiconductor device assembly that includes microbead foam.

FIG. 6 is a diagram illustrating an example of a semiconductor device assembly 600 that includes microbead foam. The semiconductor device assembly 600 may include a PCB 505 and an enclosure 605. In some cases, the enclosure 605 may include a single PCB 505. The PCB 505 may have the surface A 515 and the surface B 520. At least one of the surface A 515 and the surface B 520 may include one or more components 325. In some cases, the enclosure 605 may include two (or more) PCBs, such as the first PCB 505-1 and the second PCB 505-2. The first PCB 505-1 may have the surface A 515 and the surface B 520 and the second PCB 505-2 may have the surface C 525 and the surface D 530. At least one of the surface A 515 and the surface B 520 may include one or more components 325 and at least one of the surface C 525 and the surface D 530 may include one or more components 325. In some cases, the PCB 505 may be an RFR PCB. The RFR PCB 505 may be bent or folded along a wire (such as the wire 405) and may include a first interior portion, a second interior portion, a first exterior portion, and a second exterior portion. The first interior portion may be the surface A 515, the second interior portion may be the surface C 525, the first exterior portion may be the surface B 520, and the second exterior portion may be the surface D 530. Some or all of the surface A 515, the surface B 520, the surface C 525, and the surface D 530 may include one or more components 325.

As described herein, a component 325 may come into contact with or one or more other components 325, a surface of the enclosure 605, or a surface of another PCB 505. In one example, such as when the enclosure 605 includes the single PCB, a component 325 located on the surface A 515 may come into contact with an interior surface of the enclosure 605. Additionally, or alternatively, a component 325 located on surface B 520 may come into contact with another interior surface of the enclosure 605. In another example, such as when the enclosure 605 includes two (or more) PCBs, or when the enclosure 605 includes an RFR PCB, a component 325 located on the surface A 515 may come into contact with the surface C 525 or one or more components 325 located on surface C 525, a component 325 located on the surface C 525 may come into contact with the surface A 515 or one or more components 325 located on surface A 515, a component 325 located on the surface B 520 may come into contact with an interior surface of the enclosure 605, and/or a component 325 located on the surface D 530 may come into contact with another interior surface of the enclosure 605. When a component 325 comes into contact with another component 325, an interior surface of the enclosure 605, or a surface of the PCB 505, the component 325 may become damaged. For example, the component 325 may chip or may break entirely. In some cases, as described above, foam blocks may be placed on the components 325 to prevent the components 325 from becoming damaged. However, using foam blocks to prevent the components 325 from becoming damaged may be a complex process and may introduce significant manufacturing time into the semiconductor device assembly.

In some implementations, a microbead foam 610 may be used to prevent the components 325 from becoming damaged. The microbead foam 610 may be injected into the enclosure 605 via one or more injection holes 615 located on the enclosure 605. For example, the microbead foam 610 may be injected into the enclosure 605 via the injection holes 615 to fill one or more gaps 620, such as a gap 620 that is between a component 325 and another component 325, a gap 620 that is between the component 325 and an interior surface of the enclosure 605, or a gap 620 that is between the component 325 and a surface of the PCB 505. The microbead foam 610 may be injected into the enclosure 605 via the one or more injection holes 615 after the PCB 505 has been enclosed within the enclosure 605. The microbead foam 610 may expand within the enclosure 605 that includes the PCB 505 to fill the one or more gaps 620. Additional details are described herein.

The microbead foam 610 may be a foam (or a foam-like substance) that includes a plurality of microbeads. In some implementations, the microbead foam 610 may be expanding, heat-dissipating, non-conductive, non-adhesive, and electrostatically discharging. For example, the microbead foam 610 may expand at a rate that is greater than a first expansion threshold but at a rate that is less than a second expansion threshold. The microbead foam 610 may dissipate heat at a rate that is greater than a heat dissipating threshold. The microbead foam 610 may have a conductivity property that is less than a conductivity threshold. The microbead foam 610 may have an adhesive property that is less than an adhesive threshold. The microbead foam 610 may discharge electricity at a rate that is greater than (or less than) an electrostatic discharging threshold.

In some implementations, the microbead foam 610 may be a silicon-based microbead foam. In one example, the microbead foam 610 may expand to four times its original volume (after being injected into the injection holes 615)

and may develop a uniform 15 lb/ft$^3$ cell structure (240 kg/m 3). In another example, the microbead foam 610 may expand to two or three times its original volume and may develop a uniform 25 lb/ft$^3$ cell structure (400 kg/m 3). However, the microbead foam 610 may be made of any material, such as any material that satisfies one or more of the microbead foam qualities described above, and is not limited to these examples.

In some implementations, the microbead foam 610 may be injected into the enclosure 605 via the one or more injection holes 615 after the PCB 505 has been enclosed within the enclosure 605. The microbead foam 610 may expand within the enclosure 605 to fill one or more of the gaps 620. In some implementations, the microbead foam 610 may expand to fill a gap 620 that is between two components 325. For example, the microbead foam 610 may expand to fill a gap 620 between a component 325 located on surface A 515 and another component 325 located on surface C 525. The surface A 515 may be associated with a first PCB 505-1 and the surface C 525 may be associated with a second PCB 505-2. Alternatively, the surface A 515 may be associated with a surface of an RFR PCB and the surface C 525 may be associated with another surface of the RFR PCB 505. In some implementations, the microbead foam 610 may expand to fill a gap 620 between a component 325 and an interior surface of the enclosure 605. For example, the microbead foam 610 may expand to fill a gap 620 between surface B 520 and an interior surface of the enclosure 605 and/or may expand to fill a gap 620 between surface D 530 and another interior surface of the enclosure 605. The surface B 520 and surface D 530 may be associated with two different PCBs 505 (for example, when the enclosure 605 includes two or more PCBs) or may be different surfaces of the same PCB 505 (for example, when the enclosure 605 includes an RFR PCB). In some implementations, the microbead foam 610 may only partially fill the gap 620 between the two components 325 or the gap 620 between the component 325 and the interior surface of the enclosure 605. For example, the microbead foam 610 may partially fill the gap 620 between the two components 325 to reduce or eliminate a likelihood that the two components 325 come into contact with each other, or may partially fill the gap 620 between a component 325 and the interior surface of the enclosure 605 to reduce or eliminate the likelihood that the component 325 comes into contact with the interior surface of the enclosure 605. In some implementations, the enclosure 605 that includes the PCB 505 may include a plurality of gaps, and the microbead foam 610 may only fill a portion of gaps 620 of the plurality of gaps 620. In some implementations, the microbead foam 610 may only be needed for a gap 620 that is smaller than a gap threshold. For example, a first component 325-1 and a second component 325-2 that are separated by a gap 620 that is larger than the gap threshold may have a low likelihood (or no likelihood) of contacting each other, even when the PCB 505 is being moved. Alternatively, when the first component 325-1 and the second component 325-2 are separated by a gap 620 that is smaller than the gap threshold, the first component 325-1 and the second component 325-2 may have a higher likelihood of contacting each other.

In some implementations, the one or more injection holes 615 may be configured such that the microbead foam 610 can be injected anywhere within the enclosure 605. For example, the enclosure 605 may include a number of injection holes 615, and the microbead foam 610 may be injected into the enclosure 605 via the one or more injection holes 615 to fill any gaps within the enclosure 605. In some other implementations, the one or more injection holes 615 may be configured at specific locations on the enclosure 605. For example, the enclosure 605 may include a number of injection holes 615 at the specific locations, and the microbead foam 610 may be injected into the enclosure 605 via the one or more injection holes 615 to fill gaps 620 within specific areas of the enclosure 605.

In some implementations, a device may obtain or receive instructions for injecting the microbead foam 610 into the enclosure 605 via the one or more injection holes 615. For example, the instructions may instruct the device to inject the microbead foam 610 into one or more of the injection holes 615 based on a configuration of the PCB 505 or the semiconductor device assembly 600. The device may insert the microbead foam 610 into the one or more injection holes 615 based on the instructions. In some implementations, the device may inject the microbead foam 610 into the injection holes 615 based on a pressure. For example, the device may inject the microbead foam 610 into the enclosure 605 via the one or more injection holes 615 until a pressure threshold is reached, and may stop injecting the microbead foam 610 into the enclosure 605 via the injection holes 615 after the pressure threshold has been reached.

Using the techniques described herein, a microbead foam 610 may be used to protect the components 325 from becoming damaged. The microbead foam 610 may be injected into the enclosure 605 via one or more injection holes 615 after the PCB 505 has been enclosed within the enclosure 605. The microbead foam 610, after being injected into the enclosure 605 via the one or more injection holes 615, may expand to fill one or more gaps 620 between the component 325 and another component 325 or between the component 325 and an interior surface of the enclosure 605. Unlike the foam blocks 535, which may need to be cut to a particular size that is based on a size of the component 325, the microbead foam 610 may expand to fill gaps 620 of any size. Similarly, while the foam blocks 535 need to be placed on the component 325 prior to the PCB 505 being enclosed within the enclosure 605, the microbead foam 610 may be injected into the enclosure 605 via the injection holes 615 after the PCB 505 is enclosed within the enclosure 610. In some implementations, the microbead foam 610 may be easy to dispense and may provide increased shock and/or vibration capability. The microbead foam 610 may be easily removed or adjusted since the microbead foam 610 is non-adhesive and may not stick to the components 325 or the enclosure 605. The microbead foam 610 may be shape forming and shape retaining. For example, the microbead foam 610 may expand in the area around the component 325 and may retain a shape around the component 325 after expanding around the component 325. This may enable the microbead foam 610 to be used for components 325 having any size. For example, the microbead foam 610 may expand within the enclosure to fill gaps 620 having any size or dimensions. This may reduce a likelihood of the component 325 becoming damaged, such as from chipping or breaking as a result of contacting another component 325 or an interior surface of the enclosure 605. As a result, the semiconductor device assembly 600 may be more durable, while a manufacturing process for the semiconductor device assembly 600 may be less complex and less time consuming.

As indicated above, FIG. 6 is provided as an example. Other examples may differ from what is described with regard to FIG. 6.

Figure 7:
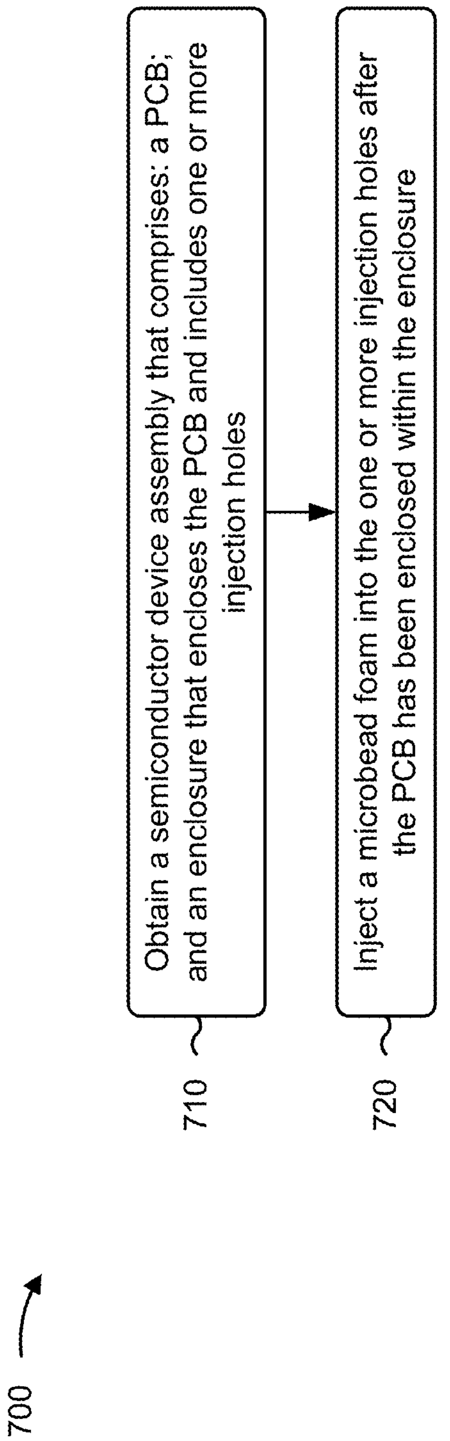
FIG. 7 is a flowchart of an example method of forming an integrated assembly or memory device having microbead foam.

FIG. 7 is a flowchart of an example method 700 of forming an integrated assembly or memory device having microbead foam. In some implementations, one or more process blocks of FIG. 7 may be performed by various semiconductor manufacturing equipment.

As shown in FIG. 7, the method 700 may include obtaining a semiconductor device assembly that comprises: a PCB; and an enclosure that encloses the PCB and includes one or more injection holes (block 710). As further shown in FIG. 7, the method 700 may include injecting a microbead foam into the one or more injection holes after the PCB has been enclosed within the enclosure (block 720).

The method 700 may include additional aspects, such as any single aspect or any combination of aspects described below and/or in connection with one or more other methods described elsewhere herein.

In a first aspect, injecting the microbead foam into the one or more injection holes comprises injecting the microbead foam into a gap that is between a surface of the enclosure and a component that is located on the PCB via the one or more injection holes.

In a second aspect, alone or in combination with the first aspect, the microbead foam, after being injected into the one or more injection holes, expands to at least partially fill one or more gaps within the semiconductor device assembly.

In a third aspect, alone or in combination with one or more of the first and second aspects, the microbead foam has an expanding property that is greater than a first expanding threshold but less than a second expanding threshold, a heat-dissipating property that is greater than a heat-dissipating threshold, a conductive property that is less than a conductivity threshold, an adhesive property that is less than an adhesion threshold, and an electrostatic discharging property is greater than an electrostatic discharging threshold.

In a fourth aspect, alone or in combination with one or more of the first through third aspects, the method 700 includes receiving instructions associated with injecting the microbead foam into the one or more injection holes, wherein injecting the microbead foam into the one or more injection holes comprises injecting the microbead foam into the one or more injection holes in accordance with the instructions after the PCB has been enclosed within the enclosure.

Although FIG. 7 shows example blocks of the method 700, in some implementations, the method 700 may include additional blocks, fewer blocks, different blocks, or differently arranged blocks than those depicted in FIG. 7. In some implementations, the method 700 may include forming the semiconductor device assembly 600, an integrated assembly that includes the semiconductor device assembly 600, any part described herein of the semiconductor device assembly 600, and/or any part described herein of an integrated assembly that includes the semiconductor device assembly 600. For example, the method 700 may include forming one or more of the parts 320, 505, 605, 610, 615, and/or 620.

Figure 8:
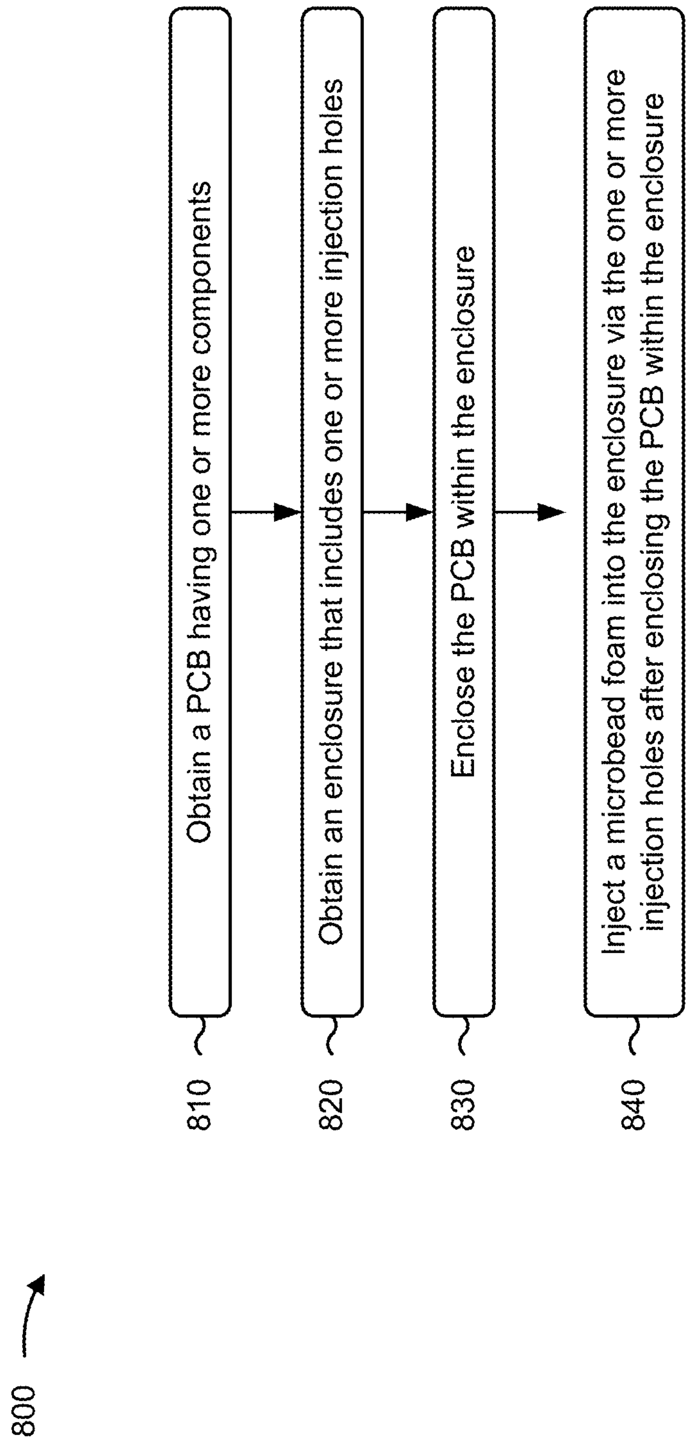
FIG. 8 is a flowchart of an example method of forming an integrated assembly or memory device having microbead foam.

FIG. 8 is a flowchart of an example method 800 of forming an integrated assembly or memory device having microbead foam. In some implementations, one or more process blocks of FIG. 8 may be performed by various semiconductor manufacturing equipment.

As shown in FIG. 8, the method 800 may include obtaining a PCB having one or more components (block 810). As further shown in FIG. 8, the method 800 may include obtaining an enclosure that includes one or more injection holes (block 820). As further shown in FIG. 8, the method 800 may include enclosing the PCB within the enclosure (block 830). As further shown in FIG. 8, the method 800 may include injecting a microbead foam into the enclosure via the one or more injection holes after enclosing the PCB within the enclosure (block 840).

The method 800 may include additional aspects, such as any single aspect or any combination of aspects described below and/or in connection with one or more other methods described elsewhere herein.

Although FIG. 8 shows example blocks of the method 800, in some implementations, the method 800 may include additional blocks, fewer blocks, different blocks, or differently arranged blocks than those depicted in FIG. 8. In some implementations, the method 800 may include forming the semiconductor device assembly 600, an integrated assembly that includes the semiconductor device assembly 600, any part described herein of the semiconductor device assembly 600, and/or any part described herein of an integrated assembly that includes the semiconductor device assembly 600. For example, the method 800 may include forming one or more of the parts 320, 505, 605, 610, 615, and/or 620.

In some implementations, a semiconductor device assembly includes a PCB having a first side and a second side, wherein at least the first side of the PCB includes a plurality of components; an enclosure that encloses the PCB and includes one or more injection holes, wherein the one or more injection holes are configured for injecting a microbead foam into a gap between the enclosure and one or more components of the plurality of components; and the microbead foam, wherein at least a portion of the microbead foam is located in the gap between the enclosure and the one or more components.

In some implementations, a semiconductor package includes a PCB comprising: a first exterior portion that includes at least a first component a first interior portion that includes at least a second component; a second interior portion that includes at least a third component; and a second exterior portion that includes at least a fourth component; an enclosure that encloses the PCB and that includes one or more injection holes, wherein the one or more injection holes are configured for injecting a microbead foam into one or more gaps, the one or more gaps corresponding to a first space that is between the first component and a first interior surface of the enclosure, a second space that is between the second component and the third component, a third space that is between the second component and the second interior portion or between the third component and the first interior portion, or a fourth space that is between the fourth component and a second interior surface of the enclosure; and the microbead foam, wherein at least a portion of the microbead foam is located in the one or more gaps.

In some implementations, a method includes obtaining a semiconductor device assembly that comprises: a PCB and an enclosure that encloses the PCB and includes one or more injection holes; and injecting a microbead foam into the one or more injection holes after the PCB has been enclosed within the enclosure.

In some implementations, a method includes obtaining a PCB having one or more components; obtaining an enclosure that includes one or more injection holes; enclosing the PCB within the enclosure; and injecting a microbead foam into the enclosure via the one or more injection holes after enclosing the PCB within the enclosure.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like. All ranges described herein are inclusive of numbers at the ends of those ranges, unless specifically indicated otherwise.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor device assembly, comprising:

a printed circuit board (PCB) having a first side and a second side, wherein at least the first side of the PCB includes a plurality of components;

an enclosure that encloses the PCB and includes one or more injection holes, wherein the one or more injection holes are configured for injecting a microbead foam into a gap between the enclosure and one or more components of the plurality of components; and the microbead foam, wherein at least a portion of the microbead foam is located in the gap between the enclosure and the one or more components.

2. The semiconductor device assembly of claim 1, wherein the microbead foam is configured to be injected into the one or more injection holes and expanding in the gap between the enclosure and the one or more components.

3. The semiconductor device assembly of claim 2, wherein the microbead foam is a silicon-based microbead foam.

4. The semiconductor device assembly of claim 1, wherein the microbead foam is an expanding, heat-dissipating, non-conducting, non-adhering, and electrostatically discharging microbead form.

5. The semiconductor device assembly of claim 1, wherein the gap is a space that is between a top surface of a component of the one or more components and an interior surface of the enclosure.

6. The semiconductor device assembly of claim 5, wherein the space between the top surface of the component and the interior surface of the enclosure is smaller than a space threshold.

7. The semiconductor device assembly of claim 1, wherein the second side of the PCB includes another plurality of components, wherein the one or more injection holes are configured for injecting the microbead foam between the enclosure and one or more other components of the other plurality of components, and wherein another portion of the microbead foam is located in another gap between the enclosure and the one or more other components.

8. The semiconductor device assembly of claim 1, wherein the second side of the PCB does not include any components, wherein the one or more injection holes are configured for injecting the microbead foam between the enclosure and the second side of the PCB, and wherein another portion of the microbead foam is located in another gap between the enclosure and the second side of the PCB.

9. The semiconductor device assembly of claim 1, further comprising: another PCB having a first side and a second side, wherein at least the first side of the other PCB includes another plurality of components, wherein the enclosure encloses the PCB and the other PCB, and includes the one or more injection holes, and wherein the one or more injection holes are configured for injecting the microbead foam into a first gap between the enclosure and the one or more components of the plurality of components and a second gap between the enclosure and one or more other components of the other plurality of components.

10. The semiconductor device assembly of claim 1, wherein the one or more injection holes are configured for injecting the microbead foam into the gap between the enclosure and the one or more components after the PCB has been enclosed within the enclosure.

11. The semiconductor device assembly of claim 1, wherein the PCB is a rigid PCB.

12. The semiconductor device assembly of claim 1, wherein the PCB is a flexible PCB.

13. A semiconductor package, comprising:

a printed circuit board (PCB) comprising:

a first exterior portion that includes at least a first component a first interior portion that includes at least a second component;

a second interior portion that includes at least a third component; and a second exterior portion that includes at least a fourth component;

an enclosure that encloses the PCB and that includes one or more injection holes, wherein the one or more injection holes are configured for injecting a microbead foam into one or more gaps, the one or more gaps corresponding to a first space that is between the first component and a first interior surface of the enclosure, a second space that is between the second component and the third component, a third space that is between the second component and the second interior portion or between the third component and the first interior portion, or a fourth space that is between the fourth component and a second interior surface of the enclosure; and the microbead foam, wherein at least a portion of the microbead foam is located in the one or more gaps.

14. The semiconductor package of claim 13, wherein the PCB further includes a wire that separates the first interior portion from the second interior portion and the first exterior portion from the second exterior portion, and wherein the PCB is at least partially folded along the wire.

15. The semiconductor package of claim 13, wherein the PCB is a rigid flex rigid printed circuit board.

16. The semiconductor package of claim 13, wherein the microbead foam is configured to be injected into the one or more injection holes and expanding within the one or more gaps.

17. The semiconductor package of claim 16, wherein the microbead foam is a silicon-based microbead foam.

18. The semiconductor package of claim 13, wherein the microbead foam is an expanding, heat-dissipating, non-conducting, non-adhering, and electrostatically discharging microbead form.

19. The semiconductor package of claim 13, wherein the first space is between a top portion of the first component and the first interior surface of the enclosure, the second space is between a top portion of the second component and a top portion of the third component, the third space is between a top portion of the second component and a surface of the second interior portion that does not include the third component or is between a top portion of the third component and a surface of the first interior portion that does not include the second component, and the fourth space is between a top surface of the fourth component and the second interior surface of the enclosure.

20. The semiconductor package of claim 13, wherein the one or more injection holes are configured for injecting the microbead foam into the first space, the second space, the third space, and the fourth space after the PCB has been enclosed within the enclosure.

21. A method, comprising:

obtaining a semiconductor device assembly that comprises:

a printed circuit board (PCB) having a first side and a second side, wherein at least the first side of the PCB includes a plurality of components; and an enclosure that encloses the PCB and includes one or more injection holes wherein the one or more injection holes are configured for injecting a microbead foam into a gap between the enclosure and one or more components of the plurality of components; and injecting the microbead foam into the gap between the enclosure and the one or more components after the PCB has been enclosed within the enclosure, wherein at least a portion of the microbead foam is located in the gap between the enclosure and the one or more components.

22. The method of claim 21, wherein the microbead foam is configured to be injected into the one or more injection holes and expanding in the gap between the enclosure and the one or more components.

23. The method of claim 22, wherein the microbead foam is a silicon-based microbead foam.

24. The method of claim 21, wherein the microbead foam is an expanding, heat-dissipating, non-conducting, non-adhering, and electrostatically discharging microbead form.

25. The method of claim 21, wherein the gap is a space that is between a top surface of a component of the one or more components and an interior surface of the enclosure.

* * * * *